(12) United States Patent
Castenmiller et al.

(10) Patent No.: US 6,894,261 B2
(45) Date of Patent: May 17, 2005

(54) POSITION MEASURING SYSTEM FOR USE IN LITHOGRAPHIC APPARATUS

(75) Inventors: Thomas J. M. Castenmiller, Eindhoven (NL); Andreas B G. Ariens, Utrecht (NL); Martinus H. H. Hoeks, Breugel (NL); Patrick D. Vogelsang, Veldhoven (NL); Erik R. Loopstra, Eindhoven (NL); YimBun P. Kwan, Eindhoven (NL)

(73) Assignee: ASML Netherlands B.V., Veldhoven (NL)

(*) Notice: Subject to any disclaimer, the term of this patent is extended or adjusted under 35 U.S.C. 154(b) by 0 days.

(21) Appl. No.: 09/739,622

(22) Filed: Dec. 20, 2000

(65) Prior Publication Data

US 2001/0011712 A1 Aug. 9, 2001

(30) Foreign Application Priority Data

Dec. 22, 1999 (EP) .............................................. 99310407

(51) Int. Cl.$^7$ ............................................... G01B 11/03
(52) U.S. Cl. .................. 250/208.1; 250/548; 250/559.3; 356/400
(58) Field of Search ............................... 250/208.1, 548, 250/559.29, 559.3, 559.39, 559.4; 356/400, 401; 355/53

(56) References Cited

U.S. PATENT DOCUMENTS

| | | | |
|---|---|---|---|
| 4,538,069 A | | 8/1985 | Shambroom et al. ..... 250/491.1 |
| 4,676,649 A | | 6/1987 | Phillips ....................... 356/401 |
| 4,686,531 A | | 8/1987 | Shambroom et al. .. 340/870.37 |
| 4,778,275 A | * | 10/1988 | Van den Brink et al. ... 356/401 |
| 5,003,342 A | * | 3/1991 | Nishi ........................... 355/43 |
| 5,100,237 A | * | 3/1992 | Wittekoek et al. ........... 356/401 |
| 5,243,195 A | * | 9/1993 | Nishi .......................... 250/548 |
| 5,481,362 A | * | 1/1996 | Van Den Brink et al. .. 356/401 |
| 5,790,258 A | | 8/1998 | Mitome et al. ............. 356/401 |
| 5,801,832 A | * | 9/1998 | Van Den Brink ........... 356/358 |
| 5,811,816 A | * | 9/1998 | Gallagher et al. ..... 250/370.15 |
| 5,907,392 A | * | 5/1999 | Makinouchi .................. 355/53 |
| 5,995,222 A | * | 11/1999 | Kanaya et al. .............. 356/345 |
| 6,020,964 A | * | 2/2000 | Loopstra et al. ............ 356/358 |
| 6,040,096 A | * | 3/2000 | Kakizaki et al. ................ 430/5 |
| 6,046,792 A | * | 4/2000 | Van Der Werf et al. ...... 355/53 |
| 6,084,673 A | * | 7/2000 | Van Den Brink et al. .. 356/358 |
| 6,122,058 A | * | 9/2000 | Van Der Werf et al. .... 356/349 |
| 6,141,108 A | * | 10/2000 | Kida et al. .................. 356/401 |
| 6,144,025 A | * | 11/2000 | Tei et al. .................... 250/226 |
| 6,160,622 A | * | 12/2000 | Dirksen et al. ............. 356/401 |
| 6,163,369 A | * | 12/2000 | Yamada et al. ............... 355/55 |
| 6,331,885 B1 | * | 12/2001 | Nishi .......................... 355/53 |

FOREIGN PATENT DOCUMENTS

| | | |
|---|---|---|
| GB | 2 162 942 A | 2/1986 |
| GB | 2 297 875 A | 8/1996 |

OTHER PUBLICATIONS

John R. Ferraro and Kazuo Nakamoto, "Introduction Raman Spectroscopy". Academic Press, Inc., San Diego, 1994.*

* cited by examiner

Primary Examiner—David V. Bruce
Assistant Examiner—Allen C. Ho
(74) Attorney, Agent, or Firm—Pillsbury Winthrop LLP

(57) ABSTRACT

A position measuring apparatus includes a radiation source mounted on an isolated reference frame and a two-dimensional radiation detector mounted adjacent the radiation source. The object whose position is to be detected has a retro-reflector mounted on it so as to reflect light emitted from the radiation source along a return path that is parallel to but displaced from the incident light path. The amount of displacement is dependent on the position of the object and is measured by the two-dimensional detector. Three such apparatus can be combined in a system to measure the position of the object in all six degrees of freedom.

23 Claims, 4 Drawing Sheets

POSITION MEASURING SYSTEM FOR USE IN LITHOGRAPHIC APPARATUS

RELATED APPLICATION

This application claims the benefit of priority to European Patent Application No. 99310407.4, filed Dec. 22, 1999, the contents of which are herein incorporated by reference.

BACKGROUND OF THE INVENTION

1. Field of the Invention

The present invention relates to a position measuring system, such as may be used to determine a reference position of a moveable object. More particularly, the invention relates to the use of the position measuring system in lithographic projection apparatus comprising:

an illumination system which supplies a projection beam of radiation;

a first object table for holding patterning device which patterns the projection beam according to a desired pattern;

a second object table for holding a substrate;

a projection system which images the patterned beam onto a target portion of the substrate; and a reference frame.

2. Description of the Related Art

The term "patterning device" should be broadly interpreted as referring to a device that can be used to endow an incoming radiation beam with a patterned cross-section, corresponding to a pattern that is to be created in a target portion of the substrate; the term "light valve" has also been used in this context. Generally, the pattern will correspond to a particular functional layer in a device being created in the target portion, such as an integrated circuit or other device (see below). Examples of such patterning means include:

A mask held by said first object table. The concept of a mask is well known in lithography, and its includes mask types such as binary, alternating phase-shift, and attenuated phase-shift, as well as various hybrid mask types. Placement of such a mask in the projection beam causes selective transmission (in the case of a transmissive mask) or reflection (in the case of a reflective mask) of the radiation impinging on the mask, according to the pattern on the mask. The first object table ensures that the mask can be held at a desired position in the incoming projection beam, and that it can be moved relative to the beam if so desired.

A programmable mirror array held by a structure, which is referred to as first object table. An example of such a device is a matrix-addressable surface having a viscoelastic control layer and a reflective surface. The basic principle behind such an apparatus is that (for example) addressed areas of the reflective surface reflect incident light as diffracted light, whereas unaddressed areas reflect incident light as undiffracted light. Using an appropriate filter, the said undiffracted light can be filtered out of the reflected beam, leaving only the diffracted light behind; in this manner, the beam becomes patterned according to the addressing pattern of the matrix-addressable surface. The required matrix addressing can be performed using suitable electronic means. More information on such mirror arrays can be gleaned, for example, from U.S. Pat. Nos. 5,296,891 and 5,523,193, which are incorporated herein by reference.

A programmable LCD array held by a structure, which is referred to as first object table. An example of such a construction is given in U.S. Pat. No. 5,229,872, which is incorporated herein by reference.

For purposes of simplicity, the rest of this text may, at certain locations, specifically direct itself to examples involving a mask; however, the general principles discussed in such instances should be seen in the broader context of the patterning means as hereabove set forth.

The projection system may hereinafter be referred to as the "lens"; however, this term should be broadly interpreted as encompassing various types of projection system, including refractive optics, reflective optics, and catadioptric systems, for example. The illumination system may also include components operating according to any of these design types for directing, shaping or controlling the projection beam of radiation, and such components may also be referred to below, collectively or singularly, as a "lens". In addition, the first and second object tables may be referred to as the "mask table" and the "substrate table", respectively.

Lithographic projection apparatus can be used, for example, in the manufacture of integrated circuits (ICs). In such a case, the patterning means may generate a circuit pattern corresponding to an individual layer of the IC, and this pattern can be imaged onto a target portion (comprising one or more dies) on a substrate (silicon wafer) that has been coated with a layer of radiation-sensitive material (resist). In general, a single wafer will contain a whole network of adjacent target portions that are successively irradiated via the projection system, one at a time. In current apparatus, employing patterning by a mask on a mask table, a distinction can be made between two different types of machine. In one type of lithographic projection apparatus, each target portion is irradiated by exposing the entire mask pattern onto the target portion at once; such an apparatus is commonly referred to as a wafer stepper. In an alternative apparatus—commonly referred to as a step-and-scan apparatus—each target portion is irradiated by progressively scanning the mask pattern under the projection beam in a given reference direction (the "scanning" direction) while synchronously scanning the substrate table parallel or anti-parallel to this direction; since, in general, the projection system will have a magnification factor M (generally <1), the speed V at which the substrate table is scanned will be a factor M times that at which the mask table is scanned. More information with regard to lithographic devices as here described can be gleaned, for example, from U.S. Pat. No. 6,046,792, incorporated herein by reference.

In general, apparatus of this type contained a single first object (mask) table and a single second object (substrate) table. However, machines are becoming available in which there are at least two independently movable substrate tables; see, for example, the multi-stage apparatus described in U.S. Pat. No. 5,969,441 and U.S. Pat. No. 6,262,796, incorporated herein by reference. The basic operating principle behind such a multi-stage apparatus is that, while a first substrate table is underneath the projection system so as to allow exposure of a first substrate located on that table, a second substrate table can run to a loading position, discharge an exposed substrate, pick up a new substrate, perform some initial metrology steps on the new substrate, and then stand by to transfer this new substrate to the exposure position underneath the projection system as soon as exposure of the first substrate is completed, whence the cycle repeats itself; in this manner, it is possible to achieve a substantially increased machine throughout, which in turn improves the cost of ownership of the machine.

In a lithographic apparatus, the size of features that can be imaged onto the substrate is limited by the wavelength of the projection radiation. To produce integrated circuits with a higher density of devices and hence higher operating speeds, it is desirable to be able to image smaller features. Whilst most current lithographic projection apparatus employ ultraviolet light generated by mercury lamps or excimer lasers, it has been proposed to use higher frequency (energy) radiation, e.g. EUV or X-rays, or particle beams, e.g. electrons or ions, as the projection radiation in lithographic apparatus.

Whatever the type of lithographic apparatus it is necessary to determine accurately the position of moveable parts, such as the object tables, at any given time. Conventionally this is done using incremental sensors, such as encoders or interferometers, that is sensors which measure change in position rather than position absolutely. It is therefore necessary to provide an additional zero reference sensor, which detects when the moveable object is at the reference or zero position, to provide a basis from which the incremental position measurements can be used to calculate an absolute position. Such zero reference systems can often offer a repeatability of 1 $\mu$m or better.

In a substrate or mask positioning system it is often desirable to be able to position the mask or substrate in all 6 degrees of freedom (DOF). Six zero reference systems and six incremental positioning systems are therefore coupled together in a kinematic chain which can result in cumulative repeatability errors which are unacceptably high. Furthermore, the zero reference of the holder is often referenced to a vibration-isolated reference frame, onto which only the most critical metrology components are mounted. Zero references of encoder systems for coarse positioning do not fit into this category and so are mounted on separate structures, the position of which remains undefined at micrometer level relative to the isolated reference frame.

SUMMARY OF THE INVENTION

An object of the present invention is to provide a referencing system which allows repeatable referencing, preferably to sub-micrometer accuracy, of a moveable object relative to a reference frame. Ideally the system should provide the ability to reference the moveable object in six degrees of freedom simultaneously.

According to the present invention there is provided a lithographic projection apparatus comprising:

an illumination system which supplies a projection beam of radiation;

a first object table for holding patterning device which patterns the projection beam according to a desired pattern;

a second object table for holding a substrate;

a projection system which images the patterned beam onto a target portion of the substrate; and a reference frame; and a position measuring device comprising:

a radiation source mounted on said reference frame;

a two-dimensional radiation detector mounted in a fixed position on said reference frame; and a mirroring device mounted on one of said object tables that is moveable relative to said reference frame so as to reflect radiation emitted by said radiation source toward said radiation detector.

The above described position measuring device can measure the position of the object table in two degrees of freedom; to measure its position in six degrees of freedom, three such position measuring devices having mutually different (i.e. not parallel), preferably substantially orthogonal, orientations may be provided in the lithographic projection apparatus.

The radiation source is preferably a source of collimated radiation and may comprise a monochromatic light source such as an LED or laser diode mounted on the sensor housing or away from the reference frame and with an optical fiber to bring light emitted by said light source to beam directing optics mounted on said reference frame. This latter arrangement has the advantage of high pointing stability of the collimated light beam as well as removing a potential heat source from the reference frame, which is very sensitive to temperature fluctuations.

The two-dimensional position detector may be a two-dimensional PSD (position sensing detector), a CCD camera, a four quadrant photo-detector or any suitable two-dimensional detector array which can provide an output signal in each of two orthogonal directions as a function of the position of the reflected light beam on the detector (array). The resolution of a CCD camera used in the invention may be enhanced by sub-pixel interpolation.

According to a further aspect of the invention there is provided a method of manufacturing a device comprising:

providing a substrate provided with a radiation-sensitive layer to an object table;

providing a projection beam of radiation using the illumination system;

patterning the projection beam with a pattern in its cross section; and projecting the patterned beam onto said target portions of said substrate; wherein prior to or during the projecting, the object table that is moveable relative to said reference frame is determined to be in a reference position by emitting radiation from a radiation source mounted on said reference frame toward a mirroring device mounted on the object table, reflecting the radiation by said mirroring device and detecting the reflected radiation in a two-dimensional radiation detector mounted in a fixed position on said reference frame.

In a manufacturing process using a lithographic projection apparatus according to the invention a pattern in a mask is imaged onto a substrate which is at least partially covered by a layer of radiation-sensitive material (resist). Prior to this imaging, the substrate may undergo various procedures, such as priming, resist coating and a soft bake. After exposure, the substrate may be subjected to other procedures, such as a post-exposure bake (PEB), development, a hard bake and measurement/inspection of the imaged features. This array of procedures is used as a basis to pattern an individual layer of a device, e.g. an IC. Such a patterned layer may then undergo various processes such as etching, ion-implantation (doping), metallization, oxidation, chemo-mechanical polishing, etc., all intended to finish off an individual layer. If several layers are required, then the whole procedure, or a variant thereof, will have to be repeated for each new layer. Eventually, an array of devices will be present on the substrate (wafer). These devices are then separated from one another by a technique such as dicing or sawing, whence the individual devices can be mounted on a carrier, connected to pins, etc. Further information regarding such processes can be obtained, for example, from the book "Microchip Fabrication: A Practical Guide to Semiconductor Processing", Third Edition, by Peter van Zant, McGraw Hill Publishing Co., 1997, ISBN 0-07-067250-4.

Although specific reference may be made in this text to the use of the apparatus according to the invention in the manufacture of ICs, it should be explicitly understood that such an apparatus has many other possible applications. For example, it may be employed in the manufacture of integrated optical systems, guidance and detection patterns for magnetic domain memories, liquid-crystal display panels, thin-film magnetic heads, etc. The skilled artisan will appreciate that, in the context of such alternative applications, any use of the terms "reticle", "wafer" or "die" in this text should be considered as being replaced by the more general terms "mask", "substrate" and "target portion", respectively.

In the present document, the terms "radiation" and "beam" are used to encompass all types of electromagnetic radiation or particle flux, including, but not limited to, ultraviolet (UV) radiation (e.g. at a wavelength of 365 nm, 248 nm, 193 nm, 157 nm or 126 nm), extreme ultraviolet (EUV) radiation, X-rays, electrons and ions.

BRIEF DESCRIPTION OF THE DRAWINGS

The present invention will be described below with reference to exemplary embodiments and the accompanying schematic drawings, in which.

In the drawings, like reference numerals indicate like parts.

DETAILED DESCRIPTION OF THE EMBODIMENTS

Embodiment 1

Figure 1:
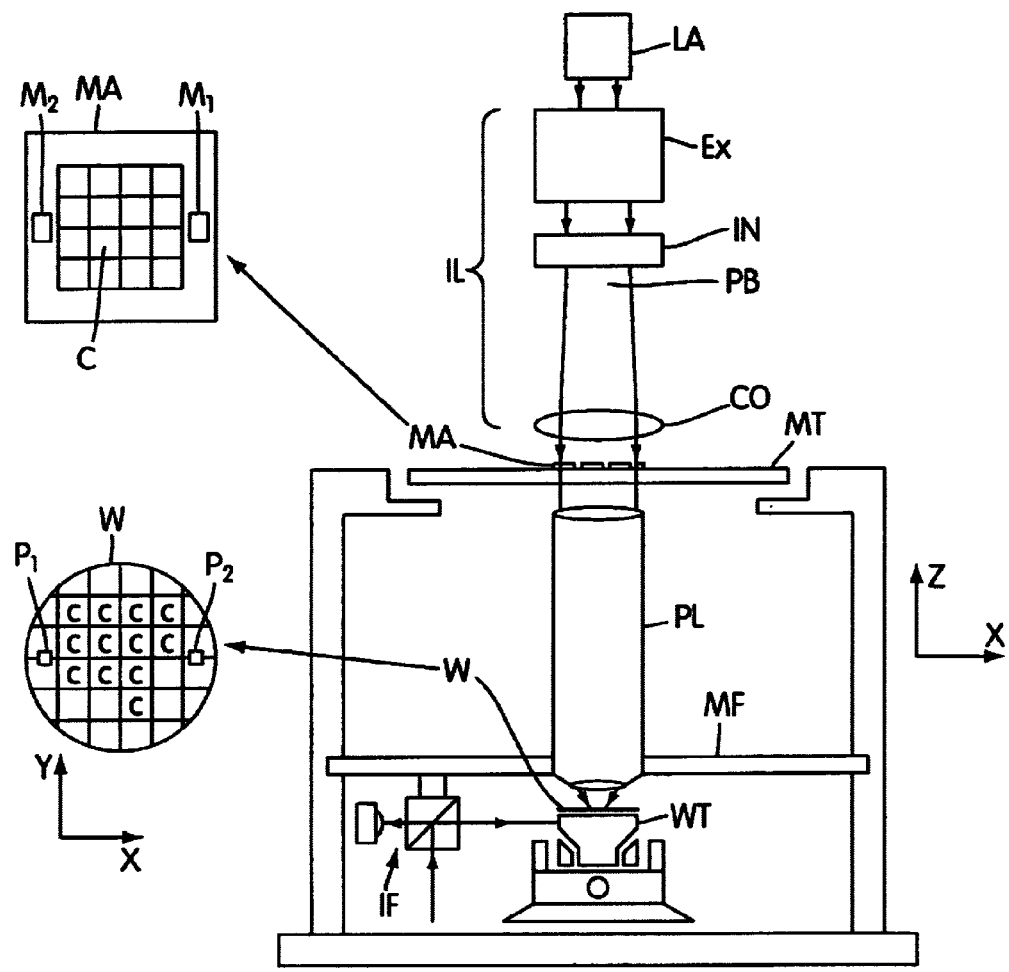
FIG. 1 depicts a lithographic projection apparatus according to a first embodiment of the invention.

FIG. 1 schematically depicts a lithographic projection apparatus according to the invention. The apparatus comprises:

- a radiation or illumination system, IL for supplying a projection beam PB of radiation (e.g. UV or EUV radiation);
- a first object table (mask table) MT provided with a mask holder for holding a mask MA (e.g. a reticle), and connected to first positioning device $M_1$, $M_2$ for accurately positioning the mask with respect to projection system ("lens")PL;
- a second object table (substrate table) WT provided with a substrate holder for holding a substrate W (e.g. a resist-coated silicon wafer), and connected to second positioning device $P_1$, $P_2$ for accurately positioning the substrate with respect to projection system PL;
- the a projection system ("lens") PL (e.g. a refractive or catadioptric system, a mirror group or an array of field deflectors) images an irradiated portion of the mask MA onto a target portion C of the substrate W.

As here depicted, the apparatus is of a transmissive type (i.e. has a transmissive mask). However, in general, it may also be of a reflective type, for example.

In the example depicted here, the radiation system comprises a source LA (e.g. a Hg lamp, excimer laser, a laser-produced or discharge plasma source, an undulator provided around the path of an electron beam in a storage ring or synchrotron, or an electron or ion beam source) which produces a beam of radiation. This beam is passed along various optical components comprised in the illumination system IL,—e.g. beam shaping optics Ex, an integrator IN and a condenser CO—so that the resultant beam PB has a desired shape and intensity distribution.

The beam PB subsequently intercepts the mask MA which is held in a mask holder on a mask table MT. Having passed through the mask MA, the beam PB passes through the lens PL, which focuses the beam PB onto a target portion C of the substrate W. With the aid of the interferometric displacement measuring means (interferometers) IF, the substrate table WT can be moved accurately by the second positioning means $P_1$, $P_2$, e.g. so as to position different target portions C in the path of the beam PB. Similarly, the first positioning means $M_1$, $M_2$ and interferometric displacement measuring means can be used to accurately position the mask MA with respect to the path of the beam PB, e.g. after mechanical retrieval of the mask MA from a mask library. In general, movement of the object tables MT, WT will be realized with the aid of a long stroke module (coarse positioning) and a short stroke module (fine positioning), which are not explicitly depicted in FIG. 1.

The depicted apparatus can be used in two different modes:

1. In step mode, the mask table MT is kept essentially stationary, and an entire mask image is projected in one go (i.e. a single "flash") onto a target portion C. The substrate table WT is then shifted in the x and/or y directions so that a different target portion C can be irradiated by the beam PB;

2. In scan mode, essentially the same scenario applies, except that a given target portion C is not exposed in a single "flash". Instead, the mask table MT is movable in a given direction (the so-called "scan direction", e.g. the x direction) with a speed v, so that the projection beam PB is caused to scan over a mask image; concurrently, the substrate table WT is simultaneously moved in the same or opposite direction at a speed V=Mv, in which M is the magnification of the lens PL (typically, M=¼ or ⅕). In this manner, a relatively large target portion C can be exposed, without having to compromise on resolution.

Figure 2:
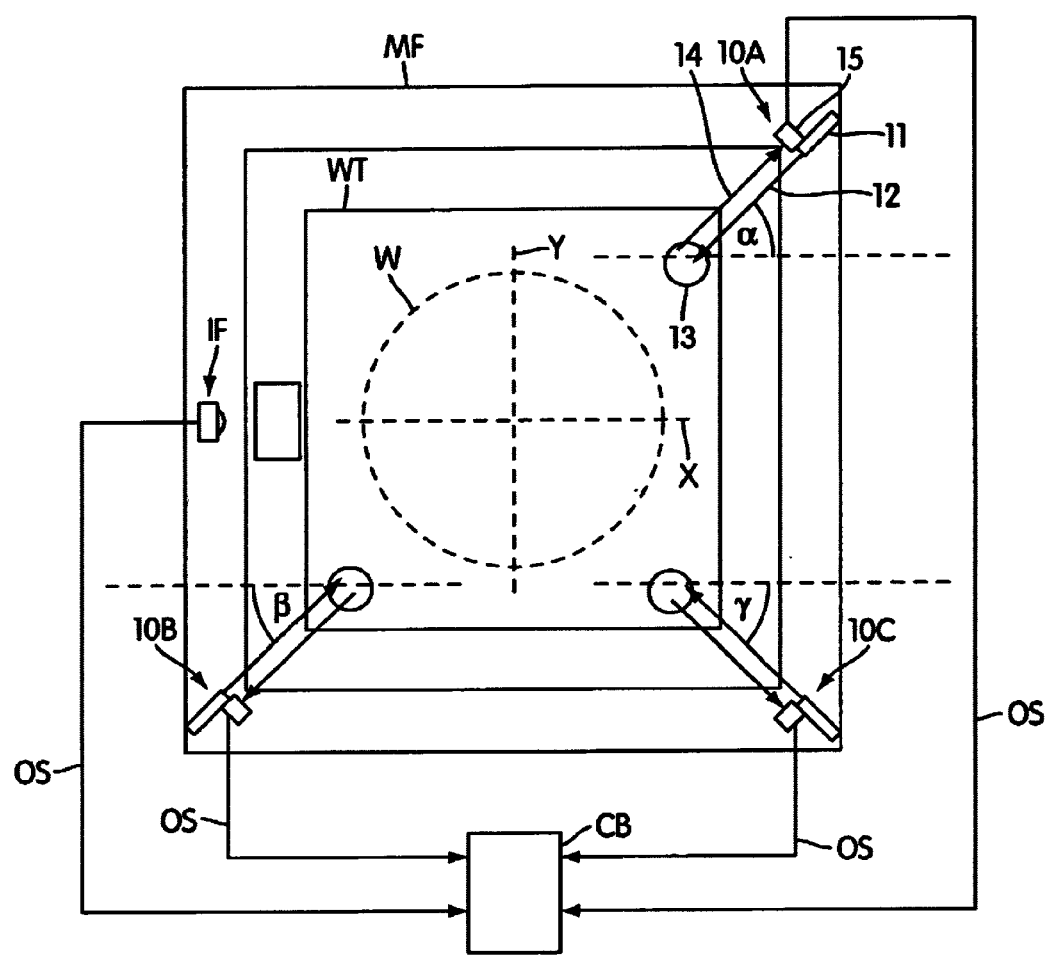
FIG. 2 is a plan view of a position detecting system according to the invention.

FIG. 2 shows in plan an embodiment of the present invention used in conjunction with the substrate (wafer) table WT. It will be appreciated that the present invention can also be used with a mask (reticle) table. The wafer W and reference X & Y-axes are shown in phantom. The Z-axis is normal to the X and Y-axes. The position measuring system according to the invention comprises three similar position measuring devices 10A, 10B, 10C. Each position measuring device comprises a radiation source 11 which emits an incident beam 12 of collimated radiation towards a retro-reflector 13, that is a reflector which reflects the incident light onto a return path that is parallel to but displaced from the incident light path. The displacement of the return beam 14, in two dimensions, is a function of the relative position of the radiation source and the reflector in a plane normal to the incident beam 12. The retro-reflector 13 may, for example, be constructed from three mutually perpendicular plane reflectors meeting at a single corner, a so-called "corner cube". The reflectors may be formed by providing a mirror coating on three external faces of a corner (notionally) cut from a transmissive cube. The return beam 14 impinges on a two-dimensional radiation detector 15.

The radiation source 11 and radiation detector 15 are mounted adjacent to one another and on the isolated reference or metrology frame MF of the lithographic apparatus in a highly stable manner. Conveniently, the radiation source 11 and radiation detector 15 may be mounted to each other or to a single bracket 16, shown in FIG. 3. The housing(s)

and/or mounting bracket(s) of the radiation detector 15 and radiation source 11 are preferably made of a material with very low thermal coefficient of expansion, such as Zerodur (RTM) or Invar, for high thermal stability. The isolated reference or metrology frame MF may also be made of such a material. The retro-reflector 13 is mounted on the wafer table WT at a convenient location, e.g. near one corner.

The two-dimensional radiation detector 15 may be a two-dimensional PSD (position sensing detector), a CCD camera, a four quadrant photo-detector or any suitable two-dimensional detector array and is mounted with its sensing plane substantially perpendicular to the incident and reflected beams 12, 14.

The positions of the position measuring devices 10A, 10B, 10C and their orientations, i.e. angles α, β, γ, are selected to provide the highest possible balanced positional sensitivity in all 6 degrees of freedom. In a specific application of the invention, the position and orientations of the position measuring devices will be determined by factors such as the shape of the substrate table and reference frame as well as the differing sensitivities of the lithographic apparatus to positional, pitch, roll and yaw errors.

Figure 3:
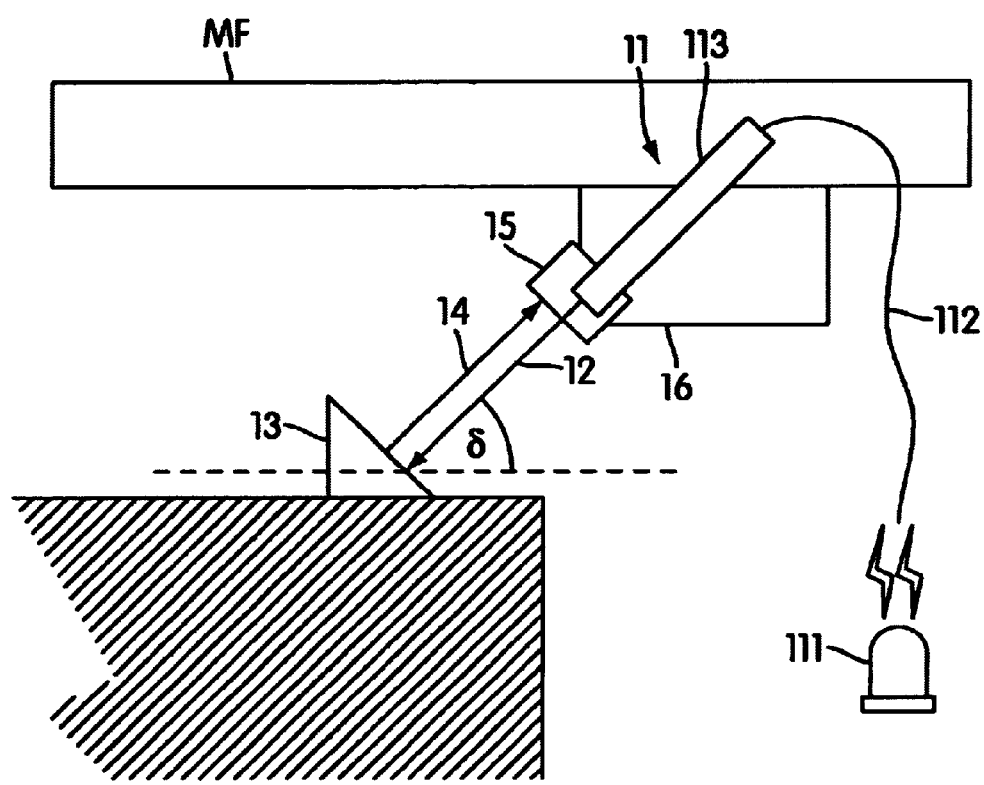
FIG. 3 is a partial cross-sectional view of the position detection system of FIG. 2.

FIG. 3 is a partial cross-sectional view of one position measuring device 10. As can there be seen the radiation source 11 and radiation detector 15 are mounted via bracket 16 to the metrology frame MF at such a position that the incident and return beams 12, 14 are inclined at an angle δ to the X-Y plane, to which the wafer W is substantially parallel. Angle δ is preferably substantially 45° so that horizontal and vertical displacements of the reflector 13 relative to the incident light beam 12 of equal magnitude result in equal displacement of the return light beam 14 on the radiation detector 15.

As shown in FIG. 3, the radiation source 11 is formed of a LED or laser diode 111 or a similar monochromatic light source for emitting light into a single mode optical fiber 112 which leads that light to collimating optics 113 mounted on the metrology frame MF. In this way the light source 111 can be placed away from the metrology frame MF and thermally isolated from it. The removal of the light source from the detector housing also leads to much higher pointing stability of the collimated beam with respect to the sensor/detector.

Figure 4:
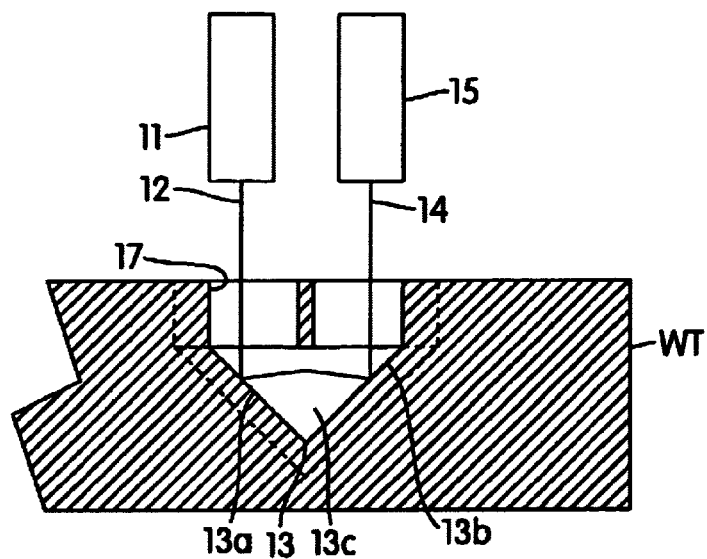
FIG. 4 is a cross-sectional view of a retro-reflector useable in the invention.

FIG. 4 shows a possible arrangement of a corner cube reflector 13 inset into the substrate table WT. In this case, the light source 11 directs the incident beam 12 into corner cube reflector 13 via aperture 17. The incident beam 12 is normal to the upper surface of the substrate table WT and is reflected by the three faces 13a, 13b, 13c of the corner cube reflector 13 so that the return beam 14 is on a parallel path to detector 15. In this arrangement, the position detection apparatus detects displacement in directions parallel to the upper surface of the substrate table WT.

Figure 5:
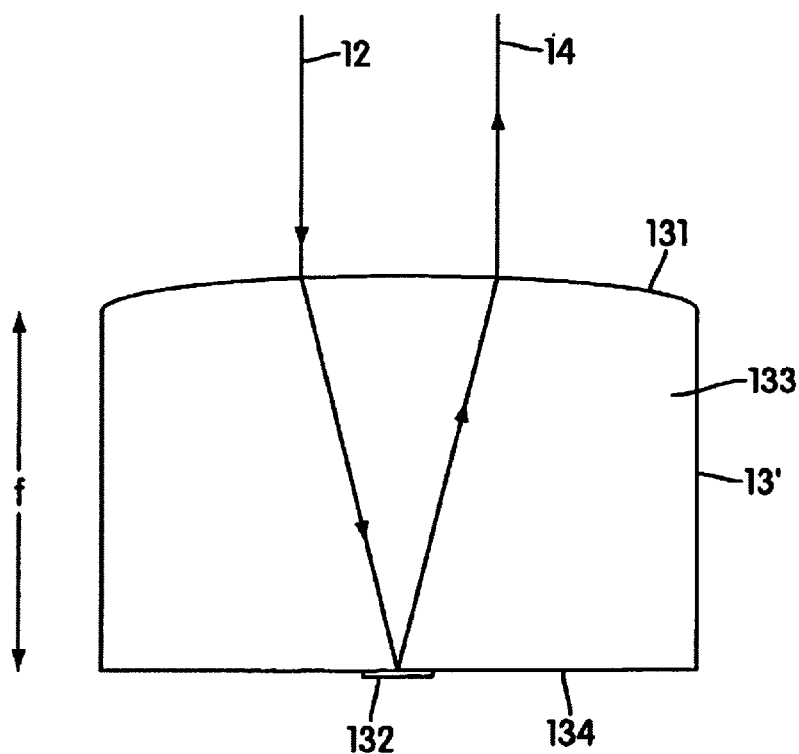
FIG. 5 is a cross-sectional view of an alternative retro-reflector useable in the invention.

An alternative form of retro-reflector 13' known as a cat's-eye, is shown in FIG. 5. This is useable in place of the corner cube retro-reflector 13. The cat's-eye 13' comprises a lens 131 and a mirror 132 placed at a distance for the lens 131 equal to its focal length, f. Conveniently, the lens 131 is formed in the curved front surface of a single transparent body 133 which has a plane rear surface 134 that is selectively silvered to form mirror 132.

The three position measuring devices of the invention, forming a position measuring system, provide six signals dependent on the position and orientation of the wafer table WT.

The system can be used in two modes:

as a zero-seeking system; the substrate holder is moved until all three detectors give their zero output in all 6 degrees of freedom;

as a position measuring system; the sensor signals are transformed by an appropriate electronic or microprocessor based control systems (not shown) to six degree of freedom positioning information relative to the isolated reference frame as required by any servo or other control devices. This can be done by sampling the sensors simultaneously or in sequence.

Ideally, the positions of the radiation source/detector units on the metrology (reference) frame and the reflectors on the table are such that the table can be moved to a position where zero outputs are given for all six degrees of freedom simultaneously. (It should be noted though that the "zero" position need not be the position at which all detectors give their zero or mid range outputs; any repeatable and unique combination of output signals from the three 2-dimensional detectors can be defined as the zero position.) In other words, the capture zones of all the measuring devices 10A, 10B, 10C should overlap. However, it may not always be possible because of the requirements of other components of the device to arrange this. In that case, the table may be moved between the capture zones of each of apparatus 10A, 10B, 10C and position signals from the interferometers IF indicating the movement of the table between specific positions as indicated by the reference detection apparatus 10A, 10B, 10C used to determine the zero reference position. Output signals OS from the position detecting apparatus 10A, 103, 10C and the interferometers IF are combined by a combiner CB to determine an absolute position of the table.

It should also be noted that the referencing process may be either static, or dynamic. In a static process, the table is moved to the reference position(s) and held stationary whilst the necessary measurements are made. In a dynamic process, which depends on the sampling frequency of the various sensors being high enough, the table may simply be moved through or near the reference position(s) and referencing of the system can be calculated from coincident measurements from the absolute and incremental reference systems. If the table does not actually pass through the reference position(s), or if samples of the measurement systems do not coincide with that passage, the measurements taken may be extrapolated or interpolated as required.

The present invention has been illustrated when used to measure the position of the substrate (wafer) table of a lithographic apparatus. It will readily be appreciated that the invention can also be used to measure the position of a mask (reticle) table in a lithographic apparatus or, indeed, any other moveable object.

A significant advantage of the position measuring signal of the present invention is that there is no residual force between the metrology (reference) frame and the wafer table, as there is in the case of inductive, magnetic or capacitive sensors. This is important as the reference or metrology frame is isolated in 6 degrees of freedom with extremely low Eigen-frequencies for maximum stability. Any disturbance forces, that might be transmitted to the frame by sensors that do involve a force coupling, would result in vibrations that would take a very long time to stabilize.

A second advantage derives from the use of collimated light. This means that the sensitivity of the sensor is substantially independent of working distance, allowing greater flexibility in the layout of the reference frame, sensor modules and object table.

Whilst we have described above a specific embodiment of the invention it will be appreciated that the invention may be practiced otherwise than described. In particular, the invention may be used to zero reference a metrology system for measuring the position of either a substrate (wafer) table or a mask (reticle) table in a lithographic apparatus. Further, in a lithographic apparatus with multiple (substrate or mask) tables and/or multiple working zones (e.g. exposure and measurement or characterization zones), multiple systems may be provided with the static parts (radiation source and detector) provided in or adjacent each working zone and reflectors provided on each table. The different sets of radiation source and detector may operate in conjunction with reflectors on any table that can be positioned within their areas of operation. The description is not intended to limit the invention.

What is claimed is:

1. A lithographic projection apparatus comprising:
    a projection beam illumination system which supplies a projection beam of radiation;
    a first object table for holding a protection beam patterning device which patterns the projection beam according to a desired pattern;
    a second object table for holding a substrate; and
    a projection system which images the patterned beam onto a target portion of the substrate;
    a reference frame; and
    a position measuring device comprising:
        a radiation source mounted on said reference frame;
        a two-dimensional radiation detector mounted in a fixed position on said reference frame; and
        a mirroring device mounted on one of said object tables that is moveable relative to said reference frame so as to reflect radiation emitted by said radiation source toward said radiation detector, wherein the radiation source and the two-dimensional radiation detector are mounted to the reference frame so that a radiation beam from the radiation source is incident at a predetermined angle relative to the movable object table and the predetermined angle is 45°.

2. Apparatus according to claim 1 wherein said radiation source is a source of collimated radiation.

3. Apparatus according to claim 1 wherein said radiation source is a source of monochromatic radiation.

4. Apparatus according to claim 1 wherein said mirroring device is a retro-reflector.

5. Apparatus according to claim 4 wherein said retro-reflector comprises a trapezoid form of a material transparent to said radiation and having three mutually perpendicular surfaces meeting at a corner, said three surfaces being provided with a reflective coating.

6. Apparatus according to claim 4 wherein said retro-reflector comprises a convergent lens and a reflective surface, said reflective surface being spaced a distance from said lens equal to the focal length of said lens.

7. Apparatus according to claim 1 wherein said radiation source comprises a light source mountable away from the reference frame, beam directing optics mountable on said reference frame and an optical fiber to couple said fight source to said beam directing optics.

8. Apparatus according to claim 1 wherein said radiation source comprises one of a laser diode and an LED as a light source.

9. Apparatus according to claim 1 wherein said two-dimensional position detector is a two-dimensional PSD, or a CCD camera, or a four quadrant photo-detector.

10. Apparatus according to claim 1 comprising three position measuring devices as therein defined.

11. Apparatus according to claim 1, wherein the mirroring device is configured to reflect the radiation onto a return path parallel to and displaced from an incident path.

12. A lithographic projection apparatus comprising:
    a projection beam illumination system which supplies a projection beam of radiation;
    a first object table for holding a protection beam patterning device which patterns the projection beam according to a desired pattern;
    a second object table for holding a substrate; and
    a projection system which images the patterned beam onto a target portion of the substrate;
    a reference frame; and
    a position measuring device comprising:
        a radiation source mounted on said reference frame;
        a two-dimensional radiation detector mounted in a fixed position on said reference frame;
    a mirroring device mounted on one of said object tables that is moveable relative to said reference frame so as to reflect radiation emitted by said radiation source toward said radiation detector; and
    an incremental position sensing device to detect a position of said moveable object table in a detection range wider than that of said position measuring device and a combiner, which combines output signals from said incremental position sensing device and said position measuring device to determine an absolute position of said object table in said detection range.

13. A method of manufacturing a device comprising:
    providing a substrate provided with a radiation-sensitive layer to an object table;
    providing a projection beam of radiation using an illumination system;
    patterning the projection beam to form a pattern in its cross section; and
    projecting the patterned beam onto said target portions of said substrate;
    determining a reference position of said object table relative to a reference frame by:
        emitting radiation from a radiation source mounted on said reference frame toward a mirroring device mounted on said object table;
        reflecting the radiation; and
        detecting the reflected radiation in a two-dimensional radiation detector mounted in a fixed position on said reference frame, wherein the radiation source and the two-dimensional radiation detector are mounted to the reference frame so that a radiation beam from the radiation source is incident at a predetermined angle relative to the object table and the predetermined angle is 45°.

14. A method according to claim 13 further comprising:
    determining an absolute position of said object table by measuring movements thereof relative to said reference position using an incremental position sensing system.

15. A device manufactured according to the method of claim 13.

16. A method according to claim 13, wherein reflecting the radiation includes reflecting the radiation onto a return path that is parallel to and displaced from an incident path.

17. A position measuring device comprising:
    a radiation source mounted on a reference frame;
    a two-dimensional radiation detector mounted in a fixed position on said reference frame; and
    a mirroring device mounted on an object that is moveable relative to said reference frame so as to reflect radiation emitted by said radiation source toward said radiation detector, wherein the radiation source and the two-dimensional radiation detector are mounted to the reference frame so that a radiation beam from the radiation source is incident at a predetermined angle relative to the object table and the predetermined angle is 45°.

18. A device according to claim 17, wherein the mirroring device is configured to reflect the radiation onto a return path parallel to and displaced from an incident path.

19. A method of determining a reference position of a moveable object table comprising:

emitting radiation from a radiation source mounted on a reference frame toward a mirroring device mounted on said moveable object table;

reflecting the radiation by said mirroring device; and detecting the reflected radiation in a two-dimensional radiation detector mounted on a fixed position on said reference frame, wherein the radiation source and the two-dimensional radiation detector are mounted to the reference frame so that a radiation beam from the radiation surface is incident at a predetermined angle relative to the object table and the predetermined angle is 45°.

20. A method according to claim 19, wherein reflecting the radiation includes reflecting the radiation onto a return path that is parallel to and displaced from an incident path.

21. A lithographic projection apparatus comprising:

a projection beam illumination system which supplies a projection beam of radiation;

a first object table for holding a projection beam patterning device which patterns the projection beam according to a desired pattern;

a second object table for holding a substrate; and a projection system which images the patterned beam onto a target portion of the substrate;

a reference frame; and a position system including three position measuring devices, each position measuring device comprising:

a radiation source mounted on said reference frame;

a two-dimensional radiation detector mounted in a fixed position on said reference frame; and a mirroring device mounted on one of said object tables that is moveable relative to said reference frame so as to reflect radiation emitted by said radiation source toward said radiation detector, wherein the three position measuring devices are arranged non-parallel to each other, wherein the radiation source and the two-dimensional radiation detector are mounted to the reference frame so that a radiation beam from the radiation source is incident at a predetermined angle relative to the movable object table and the predetermined angle is 45°.

22. Apparatus according to claim 21, wherein the radiation source and the two-dimensional radiation detector of each position measuring device are adjacent to one another.

23. Apparatus according to claim 21, wherein the mirroring device is configured to reflect the radiation onto a return path parallel to and displaced from an incident path.

* * * * *